United States Patent [19]

Liang et al.

[11] Patent Number: 5,111,428

[45] Date of Patent: May 5, 1992

[54] HIGH DENSITY NOR TYPE READ ONLY MEMORY DATA CELL AND REFERENCE CELL NETWORK

[75] Inventors: Wei-Chen Liang; I-Bin Lin, both of Hsin-Chu, Taiwan

[73] Assignee: Silicon Integrated Systems Corp., Taiwan

[21] Appl. No.: 550,578

[22] Filed: Jul. 10, 1990

[51] Int. Cl.⁵ .............................................. G11C 11/40
[52] U.S. Cl. ....................................... 365/104; 365/51
[58] Field of Search ................. 365/104, 103, 51, 63

[56] References Cited

U.S. PATENT DOCUMENTS

Re. 33,261  7/1990  Baglee et al. ........................ 365/149

Primary Examiner—Terrell W. Fears
Attorney, Agent, or Firm—Fleit, Jacobson, Cohn, Price, Holman & Stern

[57] ABSTRACT

Disclosed is a high density NOR type read only memory data cell and reference cell network, in which every single data cell of the data cell network is comprised of a MOSFET the gate of which is connected to a wordline and the source and drain of which are selectively connected through buried N+ to a bitline and a voltage source (ground line or power line) permitting the sources of same group of MOSFETs to be connected together through a buried N+ and the drains of which to be connected together through another buried N+ to form a NOR type of structure so as to eliminate possible contacts and reduce space occupation. The design of reference cell network and the connection of the data cell network eliminate the isolation between different groups of MOSFETs so as to increase the density of data cells and reduce the manufacturing cost. By means of buried N+ bitline connection, the implantation of coding can be made as late as the conventional NAND type to that delivery time can be shortened.

6 Claims, 6 Drawing Sheets

- THIN OXIDE
- POLY
- P+
- CONTACT
- METAL
- N+
- BURIED N+

HIGH DENSITY NOR TYPE READ ONLY MEMORY DATA CELL AND REFERENCE CELL NETWORK

BACKGROUND OF THE INVENTION

1. Field of the Invention

The present invention relates to storage cell networks for the Mask ROM of IC memory products and more particularly to a high density NOR type read only memory data cell and reference cell network, which comprises a data cell for storage of data and a reference cell for accurate reading through contrast process, so as to achieve high density of storage operation.

2. Description of the Prior Art

Regular Mask ROM cell networks are generally constructed according to two different structures, one is of NOR type and the other is of NAND type. The NOR type can shorten the delivery time because of its late processing of code implantation. However, its manufacturing cost is relatively increased since it requires more contacts which increase the area of cell (low density). On the contrary, the NAND type requires less contacts and can relatively increase the density and reduce the manufacturing cost. However, the processing of code implantation must be completed at the initial stage in NAND type and longer delivery time will be required.

SUMMARY OF THE INVENTION

The present invention has been accomplished under the circumstances in view. It is the main object of the present invention to provide a high density NOR type read only memory data cell and reference cell network which is inexpensive to manufacture and can shorten delivery time.

According to the present invention, a high density NOR type read only memory data cell and reference cell network is designed for use in the Mask ROM of an IC memory product and generally comprised of a data cell for storage of data and a reference cell for accurate reading through contrast process.

DETAILED DESCRIPTION OF THE PREFERRED EMBODIMENTS

Figure 1:
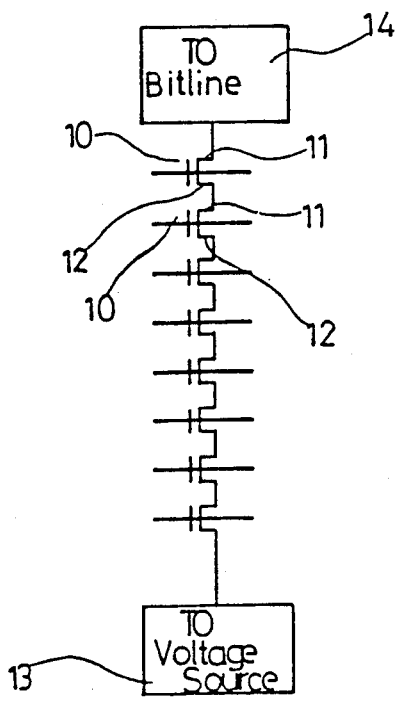
FIG. 1 is a schematic drawing illustrating a NAND type of cell network according to the prior art.

Referring to FIG. 1, therein illustrated is a circuit structure of a NAND type of cell network according to the prior art, in which each MOSFET 10 is a storage cell and two adjacent MOSFETs are connected together through NAND, i.e. the Source 11 of a MOSFET is simultaneously a Drain 12 of another MOSFET. Since no contact is required between two adjacent MOSFETs, the density can be greatly increased. The two opposite ends of the cell network are respectively connected to a Voltage source 13 and a Bitline 14. Because code implantation must be processed before the processing of Poly-Si Wordline, the manufacturing process is complicated and requires longer time to complete. Therefore, longer delivery time is required for this type of cell network.

Figure 2:
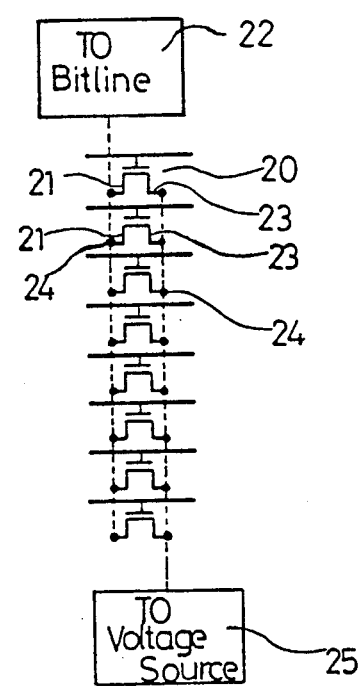
FIG. 2 is a schematic drawing illustrating a NOR type of cell network according to the prior art.

Referring to FIG. 2, therein illustrated is a circuit structure of a NOR type of cell network according to the prior art, in which each MOSFET 20 is a storage cell, the Drains 21 of all MOSFETs are commonly connected to a Metal Bitline 22 through a plurality of contacts 24 at the left side, and the Sources 23 of all MOSFETs are commonly connected to a Voltage Source 25 through a plurality of contacts 24 at the right side. Since several contacts are required, the density is relatively reduced and the manufacturing cost is increased. However, because less procedures are required after code implantation, the manufacturing time can be relatively shortened.

Figure 3:
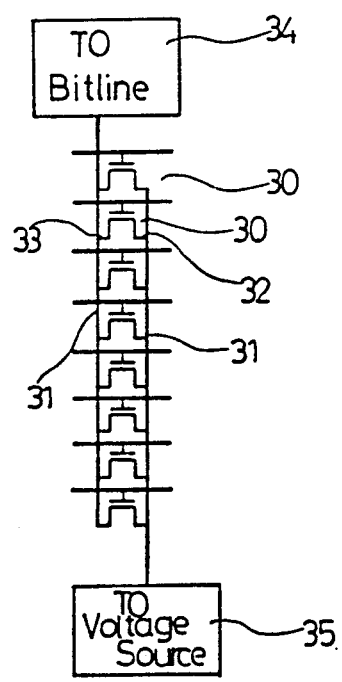
FIG. 3 is a schematic drawing illustrating a NOR type of cell network according to the present invention.

Referring to FIG. 3, therein illustrated is a circuit structure of a NOR type of cell network according to the present invention, in which buried N+ is utilized for the connection of two adjacent MOSFETs to eliminate any contact. As illustrated, the Drains 33 of all MOSFETs 30 are commonly connected to a Metal Bitline 34 through a Buried N+ 31 at the left side, and the Sources 32 of all MOSFETs 30 are commonly connected to a Voltage Source 35 through a Buried N+ 31 at the right side. Therefore, the NOR type of cell network of the present invention provides a density equal to the NAND type of the prior art and can achieve the advantage of late processing of code implantation.

Figure 4:
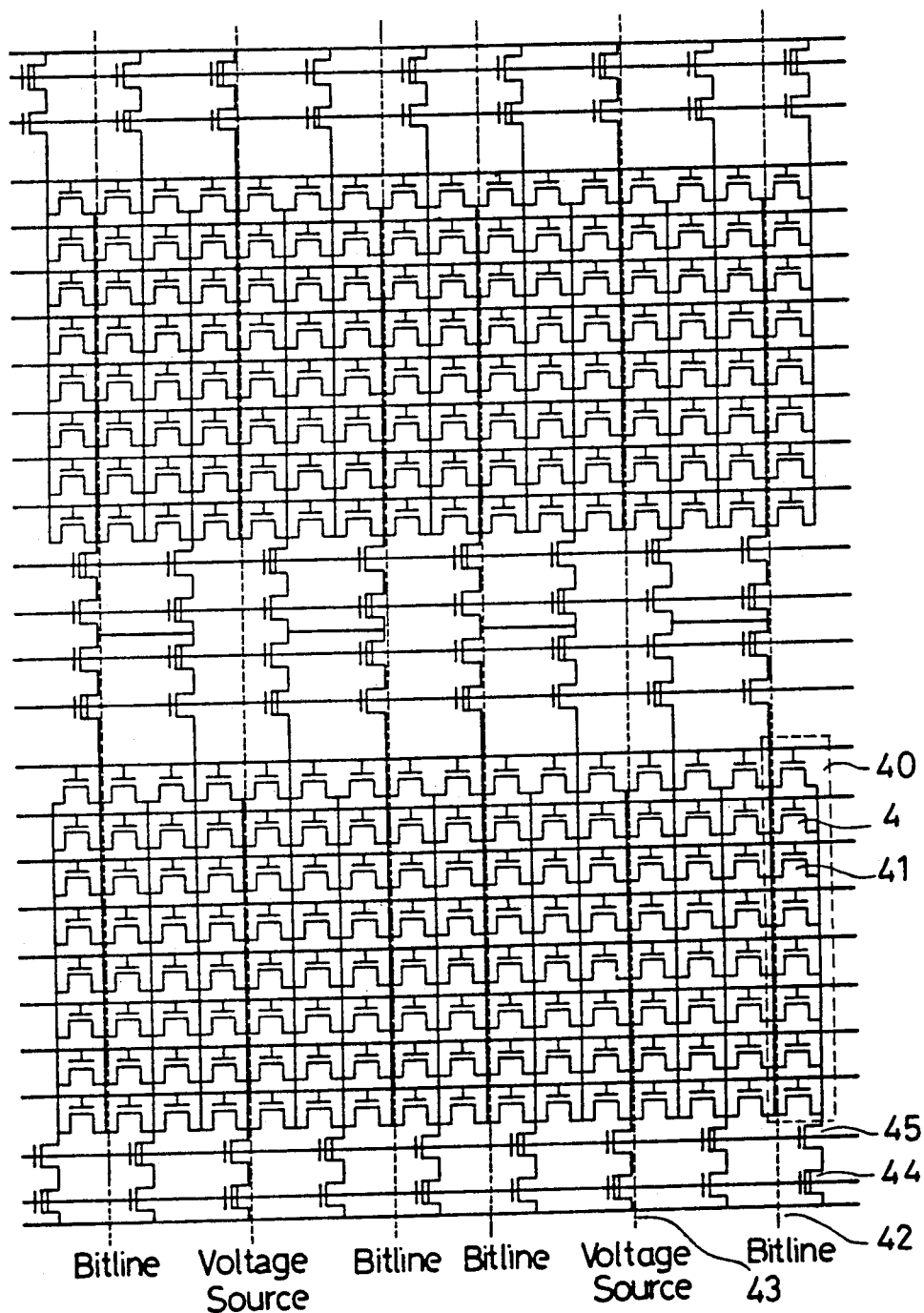
FIG. 4 is a schematic circuit diagram of a data cell network according to the present invention, in which a NOR group of cells comprises 8 data cells, i.e. 8 MOSFETs.

Referring to FIG. 4, which illustrates a circuit diagram of a data cell network according to the present invention, in which each NOR group 40 is comprised of eight data cells 41 and each data cell 41 has one end connected to a Bitline 42 and an opposite end connected to a Voltage Source 43. Before connecting to a Bitline 42 or a Voltage Source 43, two MOSFETs are added (one is a Depletion 44; the other is an Enhancement 45) to each NOR group of data cells 40 to facilitate group selection. Being different from the structure of the prior art, each two adjacent NOR groups of data cells in a data cell network of the present invention are not isolated. Therefore, an isolating area is eliminated in the present invention and high density of data cells in a data cell network becomes possible.

Figure 5:
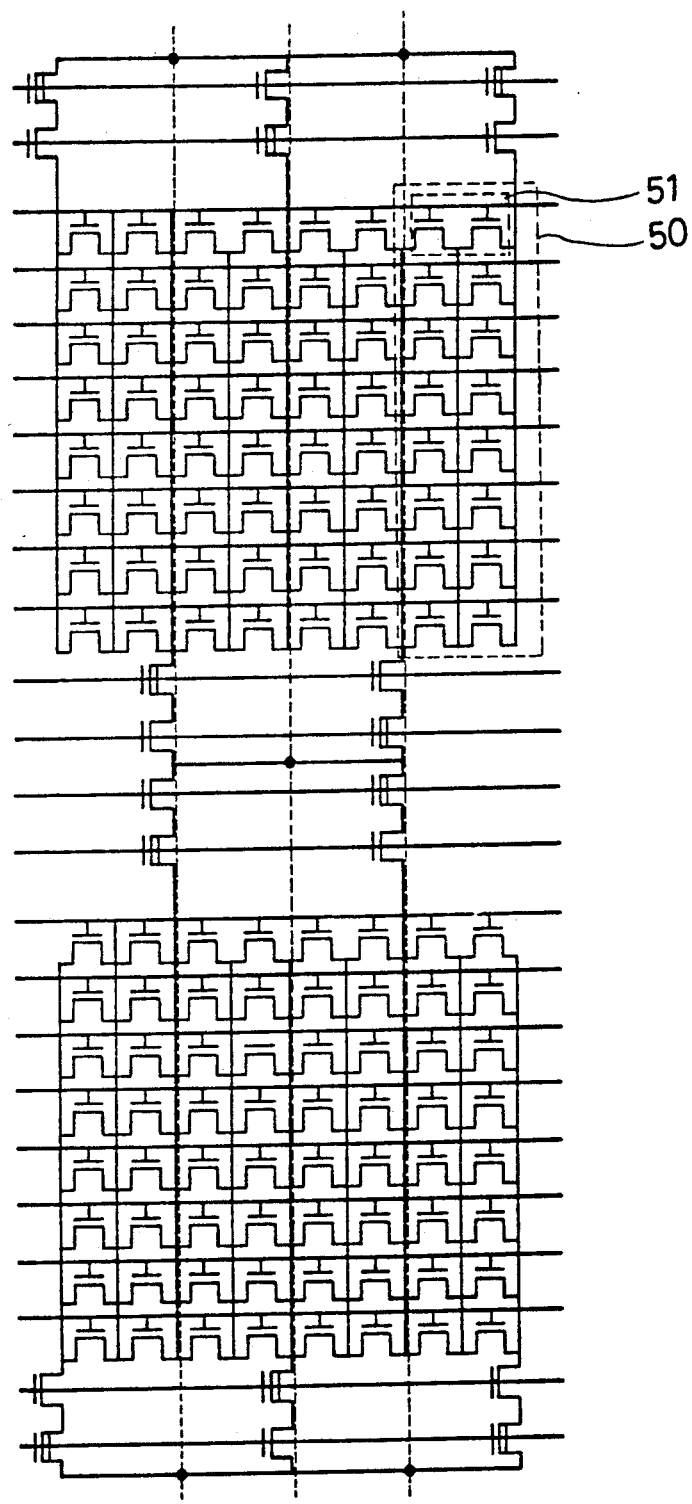
FIG. 5 is a schematic circuit diagram of a reference cell network according to the present invention, in which a NOR group of cells comprises 8 reference cells, i.e. 16 MOSFETs.

Referring to FIG. 5, there is illustrated a circuit diagram of a reference cell network according to the present invention, in which each reference cell is comprised of two adjacent MOSFETs. As illustrated, each NOR group 51 is comprised of eight reference cells 51 (i.e. 16

MOSFETs). By means of the lay-out of two MOSFETs to form a reference cell so as to provide a proper and equivalent value of resistance of match the operation of the data cell network.

Figure 6:
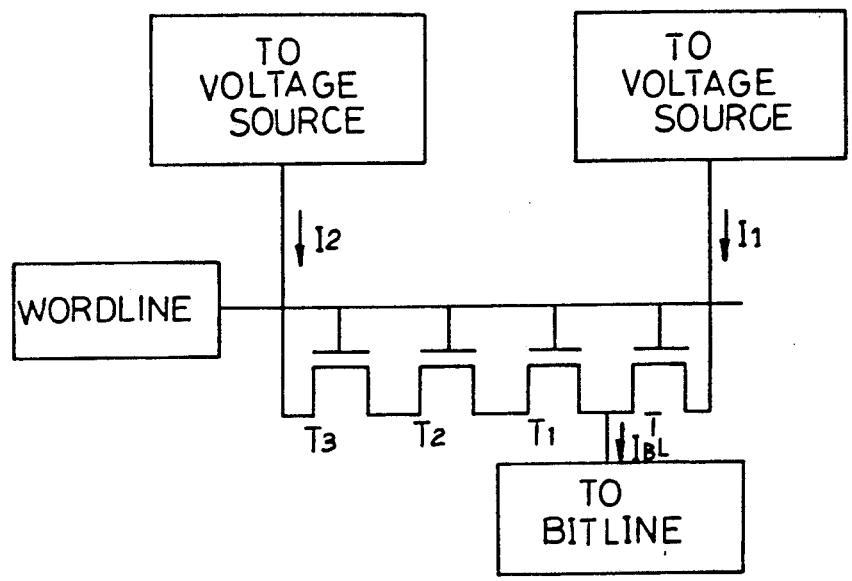
FIG. 6 illustrates an equivalent circuit for reading the data from a single cell of a data cell network according to the present invention.
Figure 7:
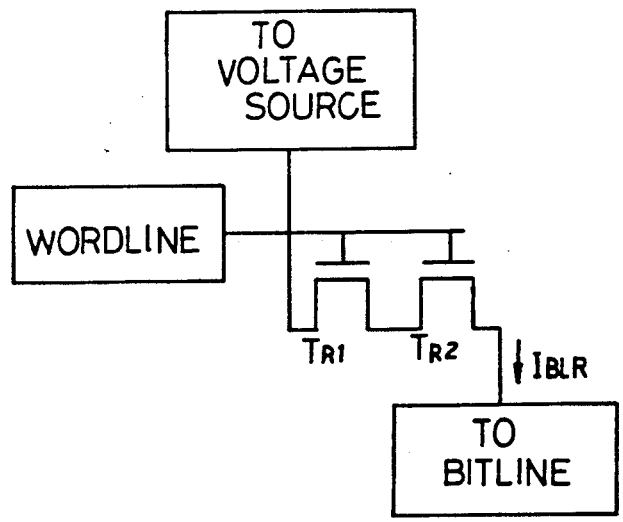
FIG. 7 illustrates an equivalent circuit for contrasting with the data in a single cell of a reference cell network according to the present invention.

Referring to FIG. 6, there is illustrated an equivalent circuit for reading the data from a single cell of a data cell network according to the present invention, in which the data to read is determined by MOSFET "T". Since isolation is eliminated between different NOR groups of cells, electric current $I_{BL}$ is not exclusively determined by MOSFET "T" but concomitantly determined by MOSFETS "$T_1$", "$T_2$" and "$T_3$". If different NOR groups of cells are respectively isolated from one another, electric current $I_{BL}$ shall be exclusively determined by MOSFET "T". The actual operation of the present invention is outlined hereinafter. Presume that the Threshold Voltage is $V_T$, $V_{T1}$, $V_{T2}$ and $V_{T3}$ respectively for the MOSFETS "T", "$T_1$", "$T_2$" and "$T_3$". When Wordline is under high voltage status (data reading mode), the differences in electric current between the MOSFETs are illustrated in the annexed Table 1, below. As illustrated in Table 1, $I_{BL} \geq 3I$ when $V_T = L$, $I_{BL} \leq I$ when $V_T = H$. Now, please refer to FIG. 7 which illustrates an equivalent circuit for contrasting with the data in a single cell of a reference cell network according to the present invention. When Wordline is under high voltage status, $I_{BLR}$ is the electric current ($I_{BLR} \approx 2I$) which passes through two MOSFETs. Therefore, $I < 2I < 3I$, and the data in a data cell can be identified.

Figure 8:
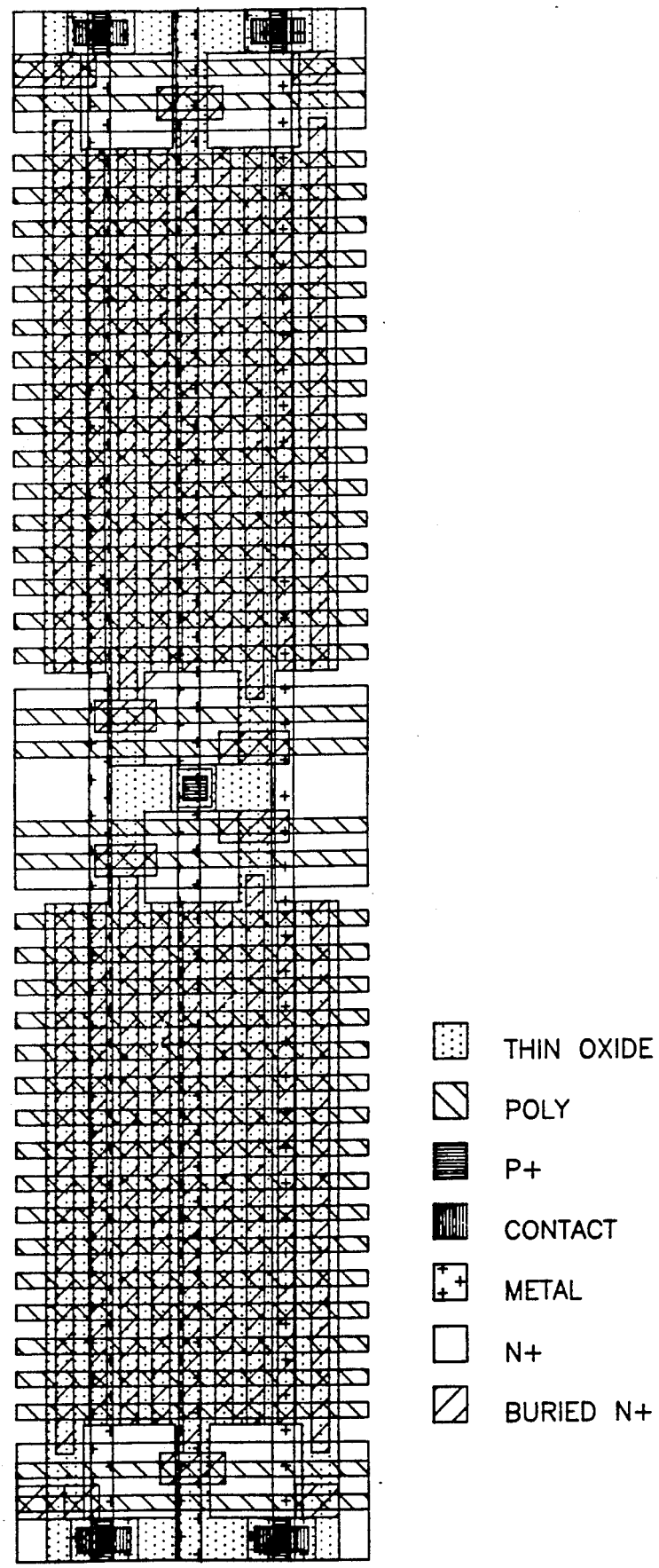
FIG. 8 illustrates the layout of a data cell network according to the present invention, in which a NOR group of cells comprises 16 data cells, i.e. 16 MOSFETs.
Figure 9:
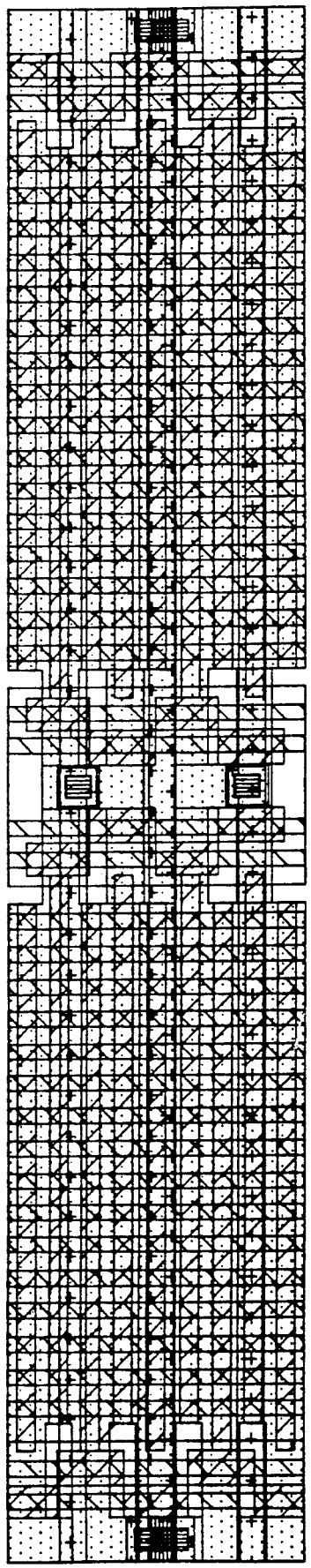
FIG. 9 illustrates the lay-out of a reference cell network according to the present invention. in which a NOR group of cells comprises 16 reference cells, i.e. 32 MOSFETs.

Now, please refer to FIGS. 8 and 9 (which illustrate the layout of a data cell network and the layout of a reference cell network respectively). From the drawings, we can understand that the quantity of cells of a group of NOR MOSFETs can be flexibly arranged according to requirement. In the present embodiment, 16 cells are taken to form a NOR group. The characteristic of high density of the present invention becomes apparent from the drawings.

The annexed Table 2 below makes a comparison in manufacturing process between the present invention and the NOR type and NAND type of the prior art. As illustrated, the later the code implantation is completed, the less the procedures are left behind and the shorter the delivery time will be.

As described above, the present invention is to provide such a high density NOR type read only memory data cell and reference cell network having numerous features each of which tends to make the structure more practical in use, inexpensive and efficient to manufacture. In addition to the layout of the cells themselves, the other portions of the data cell network or the reference cell network are identical for good tracking.

TABLE 1

| $V_T$ | $V_{T1}$ | $V_{T2}$ | $V_{T3}$ | $I_1$ | $I_2$ | $I_{BL}(= I_1 + I_2)$ |
|---|---|---|---|---|---|---|
| *L | L | L | L | ~3I | ~I | ~4I |
| L | L | L | H | ~3I | ~0 | ~3I |
| L | L | H | L | ~3I | ~0 | ~3I |
| L | L | H | H | ~3I | ~0 | ~3I |
| L | H | L | L | ~3I | ~0 | ~3I |
| L | H | L | H | ~3I | ~0 | ~3I |
| L | H | H | L | ~3I | ~0 | ~3I |
| L | H | H | H | ~3I | ~0 | ~3I |
| *H | L | L | L | ~0 | ~I | ~I |
| H | L | L | H | ~0 | ~0 | ~0 |
| H | L | H | L | ~0 | ~0 | ~0 |
| H | L | H | H | ~0 | ~0 | ~0 |
| H | H | L | L | ~0 | ~0 | ~0 |
| H | H | L | H | ~0 | ~0 | ~0 |

TABLE 1-continued

| $V_T$ | $V_{T1}$ | $V_{T2}$ | $V_{T3}$ | $I_1$ | $I_2$ | $I_{BL}(= I_1 - I_2)$ |
|---|---|---|---|---|---|---|
| H | H | H | L | ~0 | ~0 | ~0 |
| H | H | H | H | ~0 | ~0 | ~0 |

L: LOW
H: HIGH

TABLE 2

| | NOR TYPE | NAND TYPE | PATENT |
|---|---|---|---|
| 1. | N-WELL | N-WELL | N-WELL |
| 2. | LOCOS | LOCOS | LOCOS |
| 3. | P-FIELD IMPLANTATION | P-FIELD IMPLANTATION | P-FIELD IMPLANTATION |
| 4. | DEEP CHANNEL IMPLANTATION | DEEP CHANNEL IMPLANTATION | DEEP CHANNEL IMPLANTATION |
| 5. | | BURIED N+ (FOR CODING) | BURIED N+ |
| 6. | POLY | POLY | POLY |
| 7. | N-LDD IMPLANTATION | N-LDD IMPLANTATION | N-LDD IMPLANTATION |
| 8. | N+S/D IMPLANTATION | N+S/D IMPLANTATION | N+S/D IMPLANTATION |
| 9. | P+S/D IMPLANTATION | P+S/D IMPLANTATION | P+S/D IMPLANTATION |
| 10. | CODE IMPLANTATION | | CODE IMPLANTATION |
| 11. | CONTACT | CONTACT | CONTACT |
| 12. | METAL | METAL | METAL |
| 13. | PAD | PAD | PAD |

We claim:

1. A high density NOR type read only memory data cell and reference cell network comprising a data cell network coupled with a reference cell network, said data cell network being comprised of a plurality of groups of data cells each of which is comprised of a MOSFET which has a gate connected to a wordline, a source and a drain selectively connected to a bitline and a voltage source through a first buried conductor, said voltage source being a ground line or power line, wherein the sources of the MOSFETs of the same group are respectively connected together through a second buried conductor and the drains of which are respectively connected together through a third buried conductor to further couple with the connected sources through a NOR type connection to reduce space occupation, and wherein the data in the data cell network is identified by comparing the difference in electric current between the reference cell network and the data cell network.

2. The high density NOR type read only memory data cell and reference cell network of claim 1, said first, second and third buried conductors are formed of conductor material produced before the formation of the gate, which gate is formed of poly-si.

3. The high density NOR type read only memory data cell and reference cell network of claim 1, wherein the identification of the data in said data cell network is determined according to the value of electric current measured but not determined according to the availability of electric current.

4. The high density NOR type read only memory data cell and reference cell network of claim 1, wherein the selective connection of the source and drain of the MOSFET of each data cell to a bitline and a voltage source through a buried conductor is to connect the sources and drains of one or some specific groups of MOSFETs to a bitline and voltage source.

5. The high density NOR type read only memory data cell and reference cell network of claim 1, wherein the design of the reference cell network is to set up a reference value for electric current so as to achieve the comparison in electric current and the identification of the data in the data cell.

6. The high density NOR type read only memory data cell and reference cell network of claim 1, wherein a group of MOSFETs designates the MOSFETs which are connected together through a buried conductor by means of a NOR connection and the quantity of which can be determined according to requirement.

* * * * *